United States Patent
Kobayashi

(10) Patent No.: US 11,664,394 B2
(45) Date of Patent: May 30, 2023

(54) MAGE SENSOR, MANUFACTURING METHOD THEREOF, AND IMAGE CAPTURING APPARATUS WITH CIRCUIT PORTIONS AND SEPARATION PORTIONS

(71) Applicant: CANON KABUSHIKI KAISHA, Tokyo (JP)

(72) Inventor: Hirokazu Kobayashi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 280 days.

(21) Appl. No.: 17/022,325

(22) Filed: Sep. 16, 2020

(65) Prior Publication Data
US 2021/0082979 A1 Mar. 18, 2021

(30) Foreign Application Priority Data

Sep. 18, 2019 (JP) .............................. JP2019-169580

(51) Int. Cl.
*H01L 27/146* (2006.01)
*H04N 25/77* (2023.01)

(52) U.S. Cl.
CPC .. *H01L 27/14605* (2013.01); *H01L 27/14623* (2013.01); *H04N 25/77* (2023.01)

(58) Field of Classification Search
CPC ........ H01L 27/14623; H01L 27/14605; H04N 5/3745
USPC ........................... 257/257, 290, 208.1, 214 R
See application file for complete search history.

(56) References Cited

U.S. PATENT DOCUMENTS

| | | | |
|---|---|---|---|
| 8,658,956 B2* | 2/2014 | Venezia ............ | H01L 27/14689 257/222 |
| 8,884,391 B2* | 11/2014 | Fudaba ................. | H01L 31/055 438/432 |
| 8,970,757 B2 | 3/2015 | Kobayashi | |
| 9,570,507 B2* | 2/2017 | Nozaki ............. | H01L 27/14614 |
| 9,991,299 B2* | 6/2018 | Park .................. | H01L 27/14638 |
| 10,063,762 B2 | 8/2018 | Kobayashi et al. | |
| 10,368,018 B2 | 7/2019 | Kobayashi et al. | |
| 11,075,228 B2* | 7/2021 | Fang .................... | H01L 27/1218 |
| 2020/0013825 A1 | 1/2020 | Kumagai et al. | |

FOREIGN PATENT DOCUMENTS

JP 2018-160485 A 10/2018

* cited by examiner

*Primary Examiner* — Que Tan Le
*Assistant Examiner* — Mai Thi Ngoc Tran
(74) *Attorney, Agent, or Firm* — Venable LLP

(57) ABSTRACT

An image sensor comprising: a plurality of photoelectric conversion portions that convert light incident on a first surface of a semiconductor substrate into charge; a plurality of circuit portions, controlled from a second surface that is an opposite surface of the first surface of the semiconductor substrate, for transferring the charge converted by the photoelectric conversion portions; and first separation portions that separate the photoelectric conversion portions and the circuit portions for transferring the charge converted by the photoelectric conversion portions. At least part of the first separation portions are formed such that the area of the first surface is larger than the area of the second surface of at least part of the respective photoelectric conversion portions.

18 Claims, 13 Drawing Sheets

IMAGE SENSOR, MANUFACTURING METHOD THEREOF, AND IMAGE CAPTURING APPARATUS WITH CIRCUIT PORTIONS AND SEPARATION PORTIONS

BACKGROUND OF THE INVENTION

Field of the Invention

The present invention relates to an image sensor, a manufacturing method thereof, and an image capturing apparatus, and more particularly to a backside illumination image sensor that receives light on a side opposite to a surface on which a semiconductor circuit is formed, a manufacturing method thereof, and an image capturing apparatus.

Description of the Related Art

With the increase in the number of pixels of the image sensor in recent years, the area per pixel is reduced. Accordingly, in order to increase an aperture ratio, which is a ratio of the area of a photoelectric conversion portion to the pixel area, a backside illumination image sensor in which an amplifier circuit for pixel signals and a reset circuit are formed on the side opposite to the light-incident surface has been proposed. In such a backside illumination image sensor, since the amplifier circuit for pixel signals, the reset circuit, and the control wiring of these circuits are not arranged between the pixels on the light-incident surface, an embedded light-shielding portion may be used in order to suppress color mixing between pixels. In addition, a similar light-shielding portion may be provided between the holding portion to which the charge of the photoelectric conversion portion is to be transferred and the photoelectric conversion portion to reduce the parasitic sensitivity of the holding portion.

Japanese Patent Laid-Open No. 2018-160485 discloses an image sensor including a photoelectric conversion portion that converts received light into an electric charge, a holding portion that holds the electric charge transferred from the photoelectric conversion portion, and a light-shielding portion for blockings light provided between the photoelectric conversion portion and the holding portion. In this image sensor, the photoelectric conversion portion, the holding portion, and the light-shielding portion are formed in a semiconductor substrate having a predetermined thickness, and the light-shielding portion in a transfer region for transferring the charge from the photoelectric conversion portion to the holding portion is formed as a non-penetrating light-shielding portion that does not penetrate the semiconductor substrate. In addition, the light-shielding portion formed in a region other than the transfer region is formed as a penetrating light-shielding portion that penetrates the semiconductor substrate. In particular, by providing a light-shielding portion in a region corresponding to the holding portion on the light-incident surface contributes to the reduction of parasitic sensitivity.

However, even if the center of the focusing diameter of the on-chip microlens is set at the vicinity of the center of the photoelectric conversion portion as described in Japanese Patent Laid-Open No. 2018-160485, under the shooting condition where light is incident at wide variety of incident angles, that is, the diaphragm is fully opened, some light passes through the on-chip microlens and reaches the light-shielding portion on the light incident surface. In that case, the sensitivity is greatly reduced compared to a case where the diaphragm is set to a small aperture. This decrease in sensitivity when the diaphragm is fully opened becomes remarkable when the diameter of the focusing diameter must be made smaller than the diameter of the on-chip lens.

SUMMARY OF THE INVENTION

The present invention has been made in consideration of the above situation, and improves the aperture ratio while reducing the parasitic sensitivity of a charge holding portion in a backside illumination image sensor.

According to the present invention, provided is an image sensor comprising: a plurality of photoelectric conversion portions that convert light incident on a first surface of a semiconductor substrate into charge; a plurality of circuit portions, controlled from a second surface that is an opposite surface of the first surface of the semiconductor substrate, for transferring the charge converted by the photoelectric conversion portions; and first separation portions that separate the photoelectric conversion portions and the circuit portions for transferring the charge converted by the photoelectric conversion portions, wherein at least part of the first separation portions are formed such that the area of the first surface is larger than the area of the second surface of at least part of the respective photoelectric conversion portions.

Further, according to the present invention, provided is an image capturing apparatus comprising: an image sensor including: a plurality of photoelectric conversion portions that convert light incident on a first surface of a semiconductor substrate into charge; a plurality of circuit portions, controlled from a second surface that is an opposite surface of the first surface of the semiconductor substrate, for transferring the charge converted by the photoelectric conversion portions; and first separation portions that separate the photoelectric conversion portions and the circuit portions for transferring the charge converted by the photoelectric conversion portions; and a processing unit that processes a signal output from the image sensor, wherein at least part of the first separation portions are formed such that the area of the first surface is larger than the area of the second surface at least part of the respective photoelectric conversion portions.

Furthermore, according to the present invention, provided is a manufacturing method of an image sensor comprising: forming, in a semiconductor substrate, first separation portions that penetrate from a first surface on which light is incident to a second surface that is opposite side of the first surface; forming a plurality of circuit portions that are controlled by the second surface for transferring charge converted by photoelectric conversion portions; forming second separation portions that separate the circuit portions and the photoelectric conversion portions; and forming the photoelectric conversion portions that converts light incident on the first surface into charge, wherein at least part of the first separation portions and the second separation portions are formed so that the area of the first surface is larger than the area of the second surface of at least part of the respective photoelectric conversion portions.

Further features of the present invention will become apparent from the following description of exemplary embodiments (with reference to the attached drawings).

BRIEF DESCRIPTION OF THE DRAWINGS

The accompanying drawings, which are incorporated in and constitute a part of the specification, illustrate embodiments of the invention, and together with the description, serve to explain the principles of the invention.

DESCRIPTION OF THE EMBODIMENTS

Figure 1:
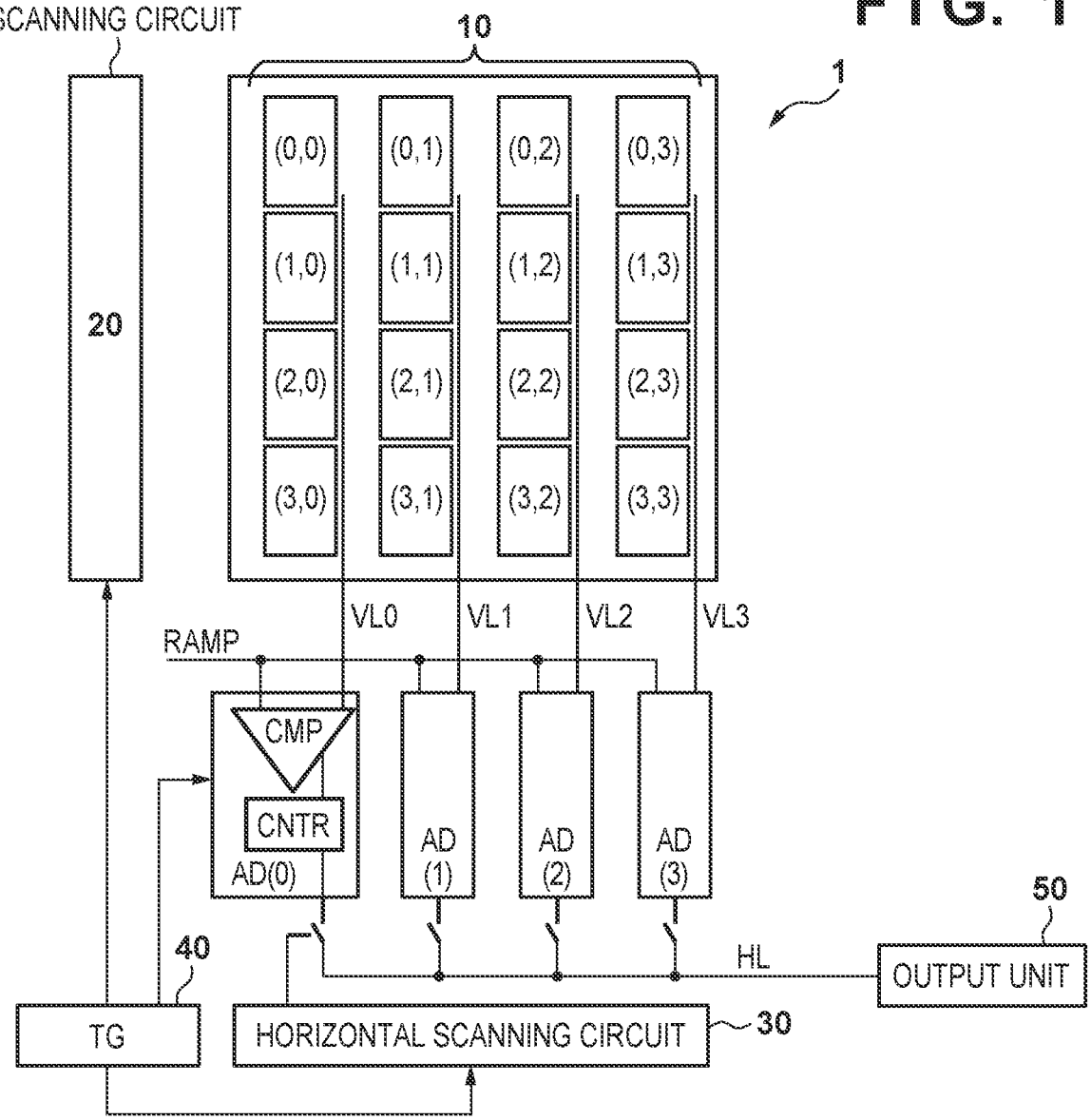
FIG. 1 is a block diagram showing a schematic configuration of an image sensor according to an embodiment of the present invention.

Hereinafter, embodiments will be described in detail with reference to the attached drawings. Note, the following embodiments are not intended to limit the scope of the claimed invention, and limitation is not made an invention that requires a combination of all features described in the embodiments. Two or more of the multiple features described in the embodiments may be combined as appropriate. Furthermore, the same reference numerals are given to the same or similar configurations, and redundant description thereof is omitted.

Configuration of Image Sensor

FIG. 1 is a block diagram showing a schematic configuration of an image sensor 1 according to an embodiment of the present invention.

The image sensor 1 includes a plurality of pixels 10 arranged in a matrix. Note that although pixels arranged in 4 rows and 4 columns are shown in FIG. 1, a large number of pixels are actually arranged in a matrix, and a pixel existing in the p-th row and the q-th column is shown as the pixel 10($p$, $q$) (p=1 to 3, q=1 to 3). In addition, in each structure of the image sensor 1 described below, "q" after the reference number or the reference sign represents a column. The pixel 10 ($p$, $q$) includes a photodiode (PD) that generates an electric charge corresponding to an amount of light that is incident via an imaging optical system (not shown).

A vertical scanning circuit 20 controls charge accumulation and readout timing of the pixel 10($p$, $q$) on a row-by-row basis.

The pixel 10($p$,$q$) is connected to a vertical line V(q), and transmits the voltage corresponding to the charge generated in the PD to an AD converter AD(q).

Each AD converter AD(q) has a comparator CMP for comparing the voltage of the vertical line VL(q) with a RAMP signal that increases/decreases in proportion to time, and a counter circuit CNTR whose enable terminal is connected to an output node of the comparator CMP. The counter circuit CNTR starts and stops counting according to the comparison result between the RAMP signal and the voltage of the vertical line, thereby holding a count value (digital signal) corresponding to the charge generated in the photodiode PD.

A horizontal scanning circuit 30 sequentially selects the count values in the horizontal direction and transfers the count values to a horizontal line HL to read the image signal for one row.

A timing generator (TG) 40 is a timing generation circuit that sequentially controls the vertical scanning circuit 20, the horizontal scanning circuit 30, the AD converters, and the like. The generation of timing signals may be realized by selecting one of several patterns of timing signals stored in a ROM (not shown) or the like.

An output unit 50 includes a well-known parallel-serial (P/S) conversion unit, and sequentially converts the format of the digital image signal transferred to the horizontal line HL into a high-speed serial transmission format such as LVDS. Further, correction processing for point defects and the like may be performed.

First Embodiment

Figure 2:
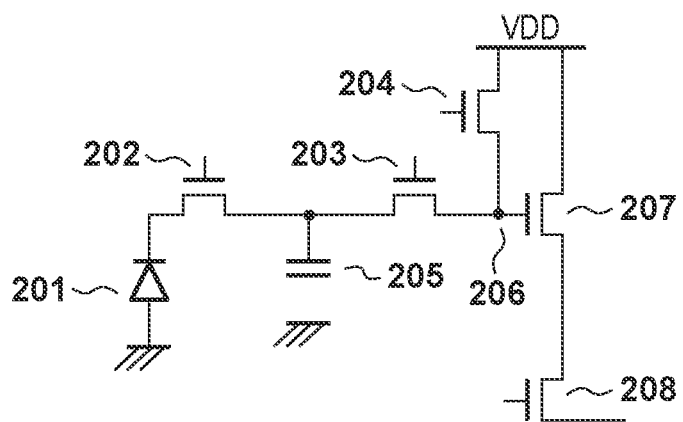
FIG. 2 is an equivalent circuit diagram showing a configuration example of a pixel according to a first embodiment.

Next, a configuration example of the pixel 10($p$, $q$) according to the first embodiment will be described with reference to an equivalent circuit diagram shown in FIG. 2.

In each pixel 10($p$, $q$), a batch transfer transistor 202 transfers the charge generated in the photodiode (PD) 201 to a batch holding unit 205. A transfer transistor 203 further transfers the charge transferred to the batch holding unit 205 to a floating diffusion (FD) portion 206. A reset transistor 204 can reset the FD portion 206 with a predetermined power supply voltage VDD. Also, by simultaneously turn on the batch transfer transistor 202 and the transfer transistor 203, it is possible to reset the batch holding unit 205 and the PD 201 with the power supply voltage VDD. Both the FD portion 206 and the batch holding portion 205 are made of an N-type semiconductor capable of accumulating charges.

The gate of an amplification transistor 207 is connected to the FD portion 206. The drain of a selection transistor 208 is connected to the source of the FD portion 206. Of these transistors, the gates of the reset transistor 204, the batch transfer transistor 202, the transfer transistor 203, and the selection transistor 208 can be controlled by the vertical scanning circuit 20. Then, when the pixels in the row direction are selected by sequentially turning on the selection transistors 208, the transfer transistors 203 are turned on. As a result, the voltage signal corresponding to the charge generated by the PD 201 is output to the source of the selection transistor 208, that is, the vertical line VL(q) via the amplification transistor 207.

Figure 3:
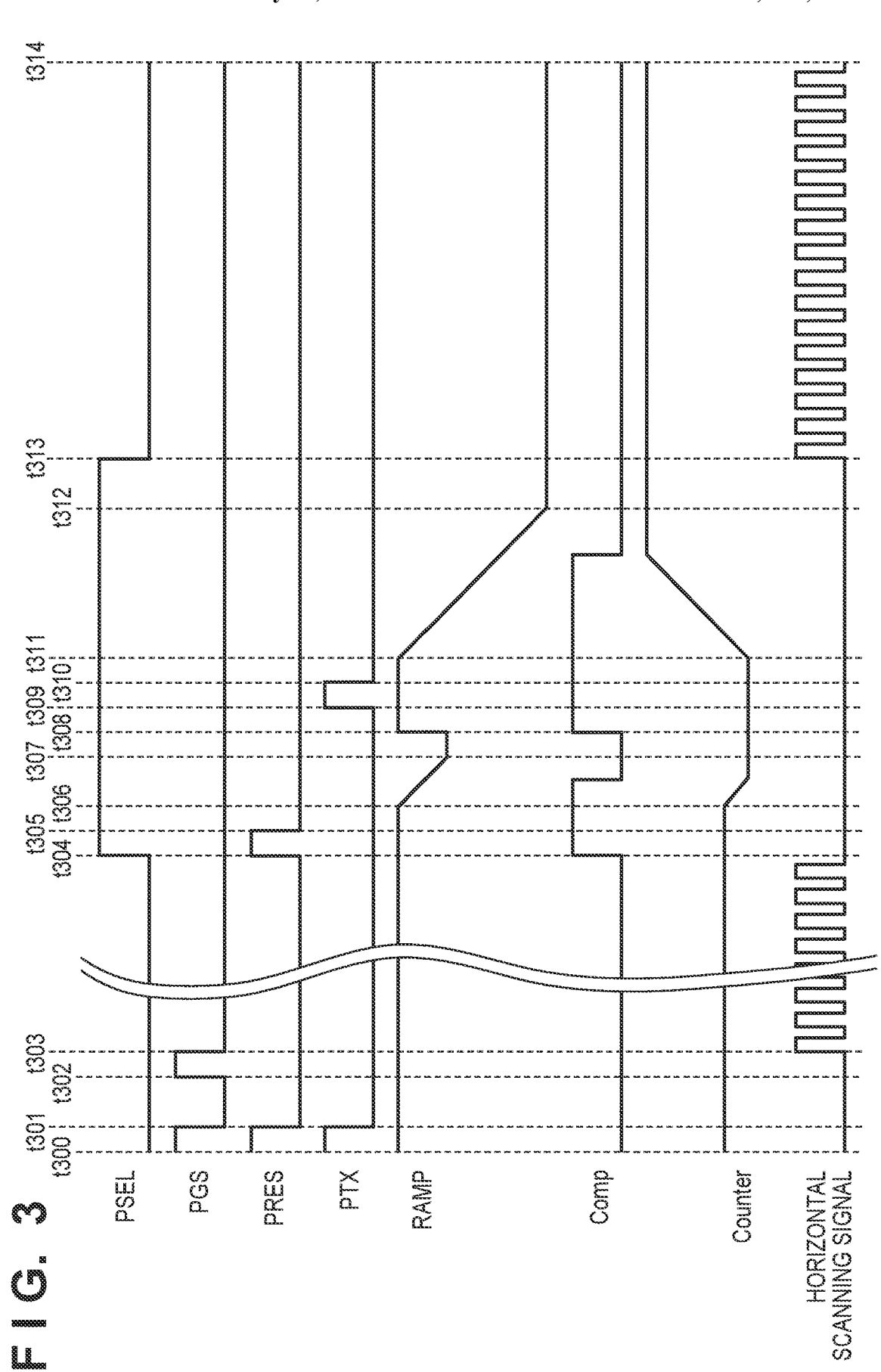
FIG. 3 is a timing chart showing a driving method of the image sensor according to the first embodiment.

Next, a driving method of the image sensor according to the present embodiment will be described. FIG. 3 is a timing chart showing the driving method of the image sensor according to the present embodiment. In FIG. 3, PSEL, PGS, PRES, and PTX represent the polarities of control signals applied to the gates of the transistors 208, 202, 204, and 203, respectively, and it is assumed that the transistors are ON when the polarity of the control signals is Hi, and the transistors are OFF when the polarity of the control signals is Lo. RAMP indicates the potential of a RAMP signal in the AD converter AD(q), Comp indicates the output polarity of the comparator CMP in the AD converter AD(q), and Counter indicates a count value counted by the counter circuit CNTR in the AD converter AD(q). A horizontal scanning signal is a signal for driving the horizontal scanning circuit 30.

First, from time t300 to time t301, the control signals PGS, PRES, and PTX are set to Hi, and the PD 201, the batch holding unit 205, and the FD portion 206 are reset to the power supply voltage VDD.

Next, from time t302 to time t303, the control signal PGS is set to Hi, and the signal charge generated in the PD 201 from time t301 to time t302 is transferred to the batch holding unit 205. Note that by setting the control signals PGS, PRES, and PTX to Hi at the same timing for all pixels, and setting the control signal PGS to Hi again at the same timing for all pixels after a predetermined period of time, charge accumulation can be performed at the same timing in all pixels.

In a state in which the vertical scanning circuit 20 sets the control signal PSEL to Hi and turns on the selection transistors 208 in the corresponding row (for example, p-th row) from time t304 to time t313, for example, the signal charges transferred to the batch holding units 205 are AD converted according to the procedure described below.

That is, from time t304 to time t305, the control signal PRES is set to Hi and the FD portion 206 is reset to the power supply voltage VDD. Then, the potential appearing on the vertical line VL(q) after the reset is released is compared with the potential of the RAMP signal falling from time t306 by the comparator CMP. When the magnitude relationship is inverted at any time up to time t307, the polarity of Comp changes to Lo, and in response to this, the count value of the counter circuit CNTR stops. Here, since the counter circuit CNTR starts down-counting at time t306 when the RAMP signal starts falling, the reset variation of the FD portion 206 can be removed together with the up-counting performed at the time of AD conversion of the signal charge described later.

At time t307, AD conversion of the potential after releasing the resetting of the FD portion 206 is completed, and at time t308, the RAMP signal is reset to the same potential as that before time t306.

From time t309 to time t310, the control signal PTX is set to Hi, and the signal charge held in the batch holding unit 205 is transferred to the FD portion 206. At time t311, AD conversion is started as time t306. However, here, AD conversion is performed by comparing the potential appearing on the vertical line VL(q) as a result of transferring the signal charge to the FD portion 206 with the RAMP signal. When the magnitude relationship is inverted at any time up to time t312, the polarity of Comp changes to Lo, and in response to this, the count value of the counter circuit CNTR stops. When the counting of the signal charge is started at time t311, since the initial value is in the negative direction by an amount corresponding to the potential after releasing the resetting of the FD portion 206, the stopped count value is the AD conversion result from which the reset variation of the FD portion 206 has been removed.

From time t313 to time t314, the horizontal scanning circuit 30 generates a horizontal scanning signal, and transfers the AD conversion result of the AD converter AD(q) of each column to the output unit 50 via the horizontal line HL.

As described above, the image sensor according to the embodiment of the present invention can perform a so-called global shutter operation in which signal charges generated in the PDs 201 are simultaneously transferred to the batch holding units 205 between time t301 and time t302. In this global shutter operation, in order to suppress the afterimage, in a period of time until the AD conversion in the current row (for example, p-th row) started at time t304 is completed, that is, from time t303 to time t304, it is desired to reduce amounts of light and charge entering the batch holding unit 205, that is, it is desirable to reduce parasitic sensitivity.

Next, the pixel 10 of the image sensor according to the first embodiment of the present invention will be described with reference to a plan view and a cross-sectional view shown in FIGS. 4 and 5. The image sensor in this embodiment is a so-called backside illumination image sensor in which transistors, a control wiring thereof, and the like are provided on the side opposite to the light incident surface. In addition, in FIGS. 4 and 5, for easy understanding of the description, the same reference numerals are given to the configurations substantially corresponding to the respective elements shown in the equivalent circuit in FIG. 2.

Figure 4:
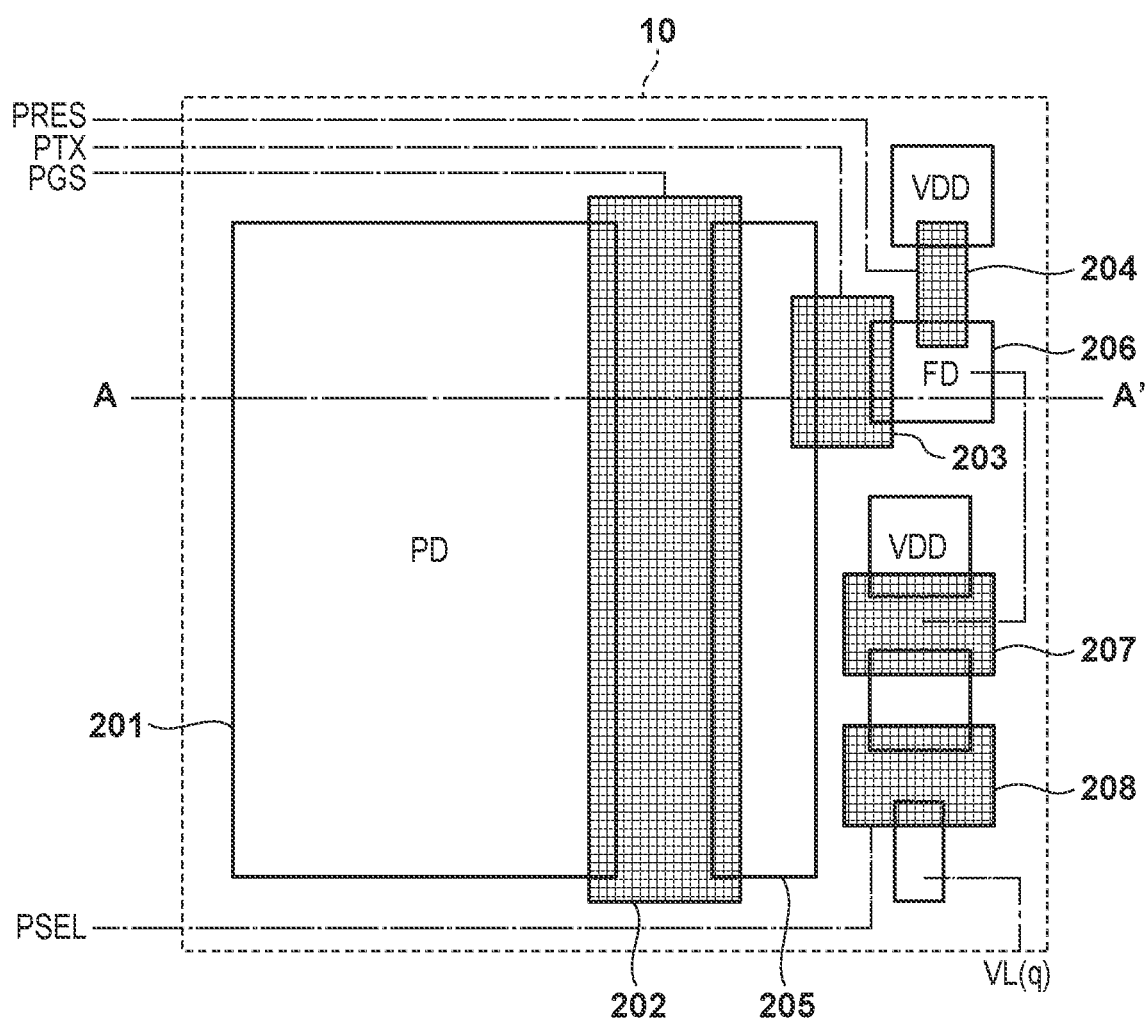
FIG. 4 is a plan view of the pixel of the image sensor according to the first embodiment as viewed from the side opposite to a light incident surface.

FIG. 4 is the plan view showing the gates of transistors and their control wiring as viewed from the side opposite to the light incident surface, and a square broken line represents a planar area for one pixel. The control wiring indicated by the dot-dash line may overlap the PD 201 on the side opposite to the light incident surface.

Figure 5:
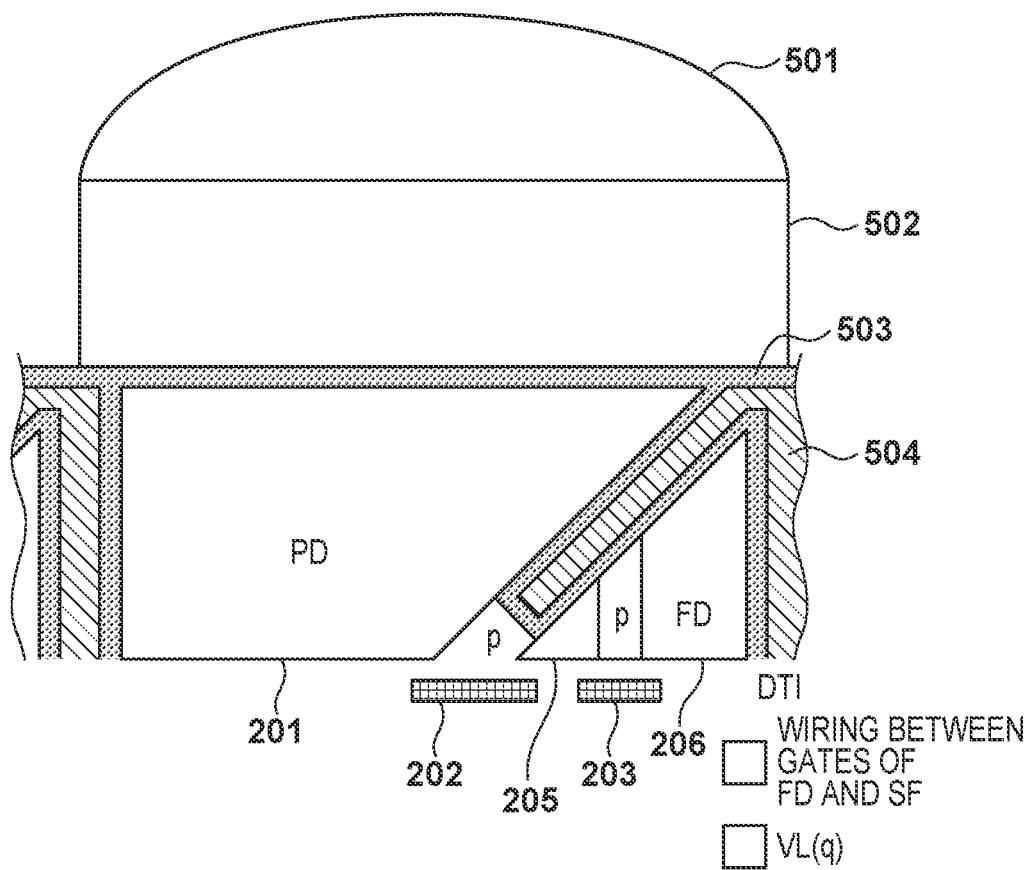
FIG. 5 is a cross-sectional view of the pixel of the image sensor according to the first embodiment.

Further, FIG. 5 shows a cross section taken along the dotted line A-A' in FIG. 4. In this cross section, the PD 201, the batch transfer transistor 202, the batch holding unit 205, the transfer transistor 203, the FD portion 206 and the vertical line VL(q) and the wiring between the gates of the FD portion 206 and the amplification transistor 207 are shown.

As shown in FIG. 5, an on-chip microlens 501 and a color filter 502 are provided on the light incident surface side. The on-chip microlens 501 can increase the sensitivity under general shooting conditions at an aperture value (F value) in a predetermined to full-open aperture range. A pinning film 503 below the color filter 502 may be continuous with the components of the inter-pixel Deep Trench Isolation (hereinafter, DTI) that is the inter-pixel separation portion. The pinning film 503 is made of $HfO_2$ (hafnium oxide), $SiO_2$ (silicon dioxide), $Ta_2O_5$ (tantalum pentoxide), $ZrO_2$ (zirconium dioxide), or the like.

The inter-pixel DTI has a structure for separating adjacent pixels, and includes the pinning film 503 and a metal light shielding member 504 made of W (tungsten), Al (aluminum), Cu (copper), and so on, shown by diagonal lines.

An intra-pixel DTI has a structure for separating the PD 201 and structure other than the PD 201 including the batch transfer transistor 202 to the FD portion 206 (circuit portion), and is obliquely provided with respect to the light incident surface as shown in FIG. 5. With such a structure, a large light incident area of the PD 201 can be secured, so that the aperture ratio can be improved. In particular, since visible light having a relatively short penetration length undergoes photoelectric conversion at a shallow depth from the light incident surface, it is possible to improve sensitivity at a full-open aperture value where the range of the light incident angle is wide.

The intra-pixel DTI also includes the pinning film 503 and the metal light shielding member 504, and may be partially continuous with the inter-pixel DTI.

Note that a semiconductor region of a conductivity type opposite to that of the PD 201 (here, a P-type semiconductor) is provided below the gates of the batch transfer transistor 202 and the transfer transistor 203. The gate voltages of these transistors become Hi at the timings described with reference to FIG. 3, whereby a charge transfer channel is formed.

Of the two types of DTI described above, the inter-pixel DTI preferably penetrates the semiconductor substrate and suppresses color mixing between the pixels. That is, of the light that has entered the PD 201, long-wavelength light with a long penetration length is reflected or absorbed by the light shielding member 504, and leakage of charges that have already been photoelectrically converted is suppressed by the pinning film 503. The intra-pixel DTI also suppresses the charge leakage from the PD 201 to the batch holding unit 205 or the FD portion 206 and the light incident on the batch holding unit 205 during the global charge accumulation period from time t301 to time t302, thereby reduces the parasitic sensitivity.

According to the first embodiment as described above, it is possible to improve the aperture ratio while reducing the parasitic sensitivity of the charge holding portion in the backside illumination image sensor.

The intra-pixel DTI may be formed only with the light blocking member 504, and even in that case, the aperture ratio can be improved while reducing the parasitic sensitivity.

Further, in order to form the charge transfer channel, it is preferable that the obliquely provided intra-pixel DTI does not penetrate to the side opposite to the light incident surface. In that case, by forming the intra-pixel DTI obliquely to an appropriate depth, it is possible to reduce the parasitic sensitivity with respect to general visible light.

Since the inter-pixel DTI and the intra-pixel DTI have different formation angles, it is necessary to manufacture them in different steps using different masks. Further, as for forming the circuit portion including the batch transfer transistor 202 through the FD portion 206, since it is preferable to form the intra-pixel DTI and the PD 201 from the light incident side, the intra-pixel DTI and the PD 201 may be formed after the circuit portion is formed.

<Modification>

Figure 6:
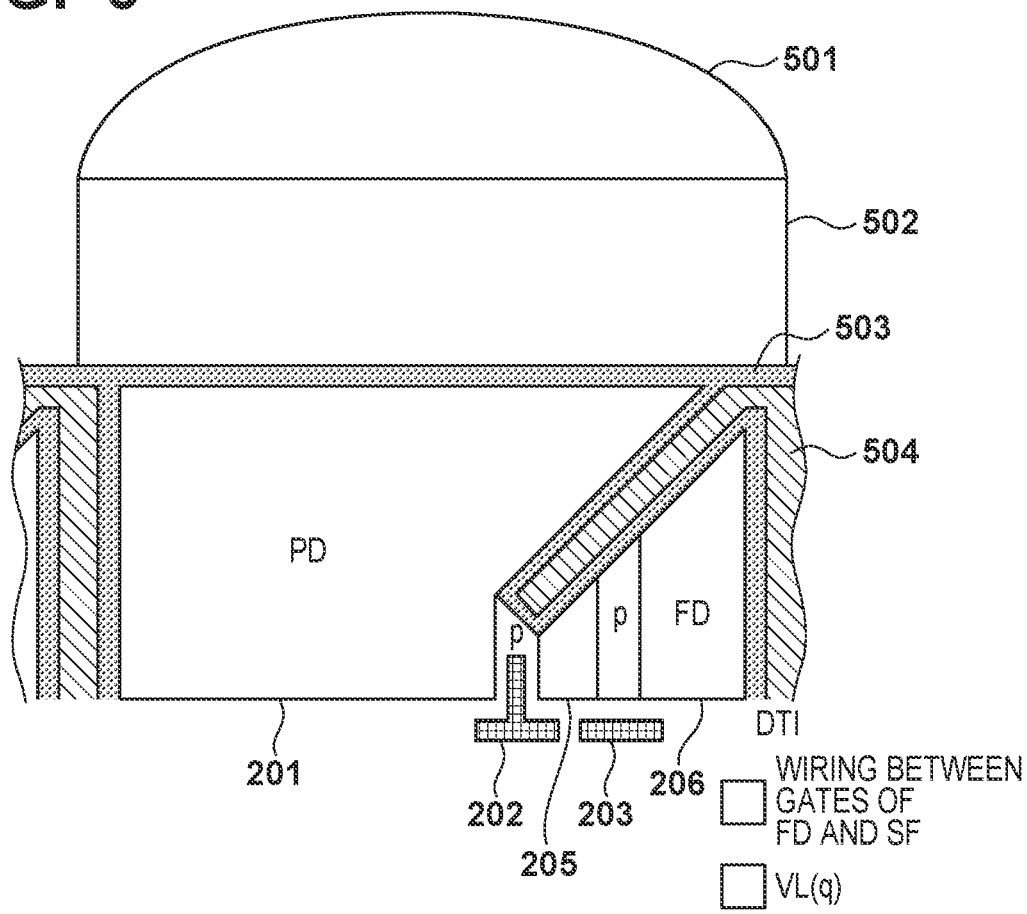
FIG. 6 is a cross-sectional view of a pixel of the image sensor according to a modification of the first embodiment.

A modification of the first embodiment is shown in FIG. 6 as a structure having a tendency to reduce the parasitic sensitivity for long-wavelength light comparing to the structure of the above-described first embodiment. The structure shown in FIG. 6 differs from the structure shown in FIG. 5 in that a thicker PD 201 is formed and a batch holding unit 205 having large capacitance is formed in the depth direction, and that the gate of the batch transfer transistor 202 is formed as a vertical transfer gate in which the channel width for charge transfer can be expanded three-dimensionally. In addition, since the vertical transfer gate forms a channel, the obliquely disposed intra-pixel DTI does not penetrate to the side opposite to the light incident surface.

First, since the PD 201 is formed thick, the component of the incident light that reaches the vicinity of the vertical transfer gate of the batch transfer transistor 202 is limited to a considerably long wavelength. In addition, if a negative potential is supplied to the embedded vertical transfer gate during the global charge accumulation period to put the semiconductor region in contact with the gate into a pinning state, it is possible to prevent charge generated by photoelectrically converting long-wavelength light that reaches a deep depth from the light incident surface from entering into the batch holding unit 205. Of course, the period for supplying the negative potential can be extended to the non-selection period of a pixel row in addition to the global charge accumulation period.

Second Embodiment

Next, a second embodiment of the present invention will be described.

The pixel having the intra-pixel DTI as in the first embodiment does not necessarily have to have the batch holding unit 205. In particular, in a configuration in which a plurality of PDs share a FD portion, a driving method in which the reset-released state of the FD portion is lengthened is also conceivable in order to speed up reading charges from a plurality of PDs, as will be described later. As a result, the reduction of the parasitic sensitivity by suppressing the charge leakage from the PD to the FD portion and the light incident on the FD portion are also important issues.

Figure 7:
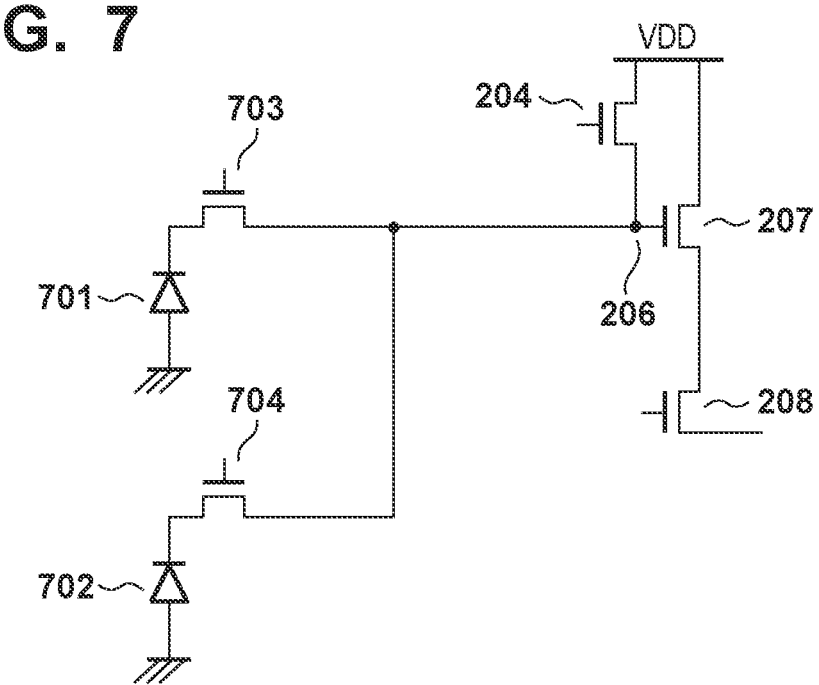
FIG. 7 is an equivalent circuit diagram showing a configuration example of a pixel according to second and third embodiments.

FIG. 7 is an equivalent circuit diagram of the pixel 10 in which two photodiodes PDA 701 and PDB 702 share one FD portion 206. The same components as those in FIG. 2 are designated by the same reference numerals. The PDA 701 and the PDB 702 are, for example, photoelectric conversion portions of pixels that are horizontally or vertically adjacent to each other. They are connected in parallel to one FD portion 206 via transfer transistors 703 and 704, respectively. The pixel according to the second embodiment does not have the batch transfer transistor 202 and the batch holding unit 205.

Although there are various driving methods, by performing AD conversion for the signal charge of the PDA 701 and the signal charge of the PDB 702 in time series as shown in the timing chart described later, for example, the amplification transistor 207 in the downstream of the FD portion 206 can be shared. By adopting such a configuration in which the FD portion 206 is shared, the number of transistors per PD can be reduced, which contributes to down-sizing of a pixel.

Figure 8:
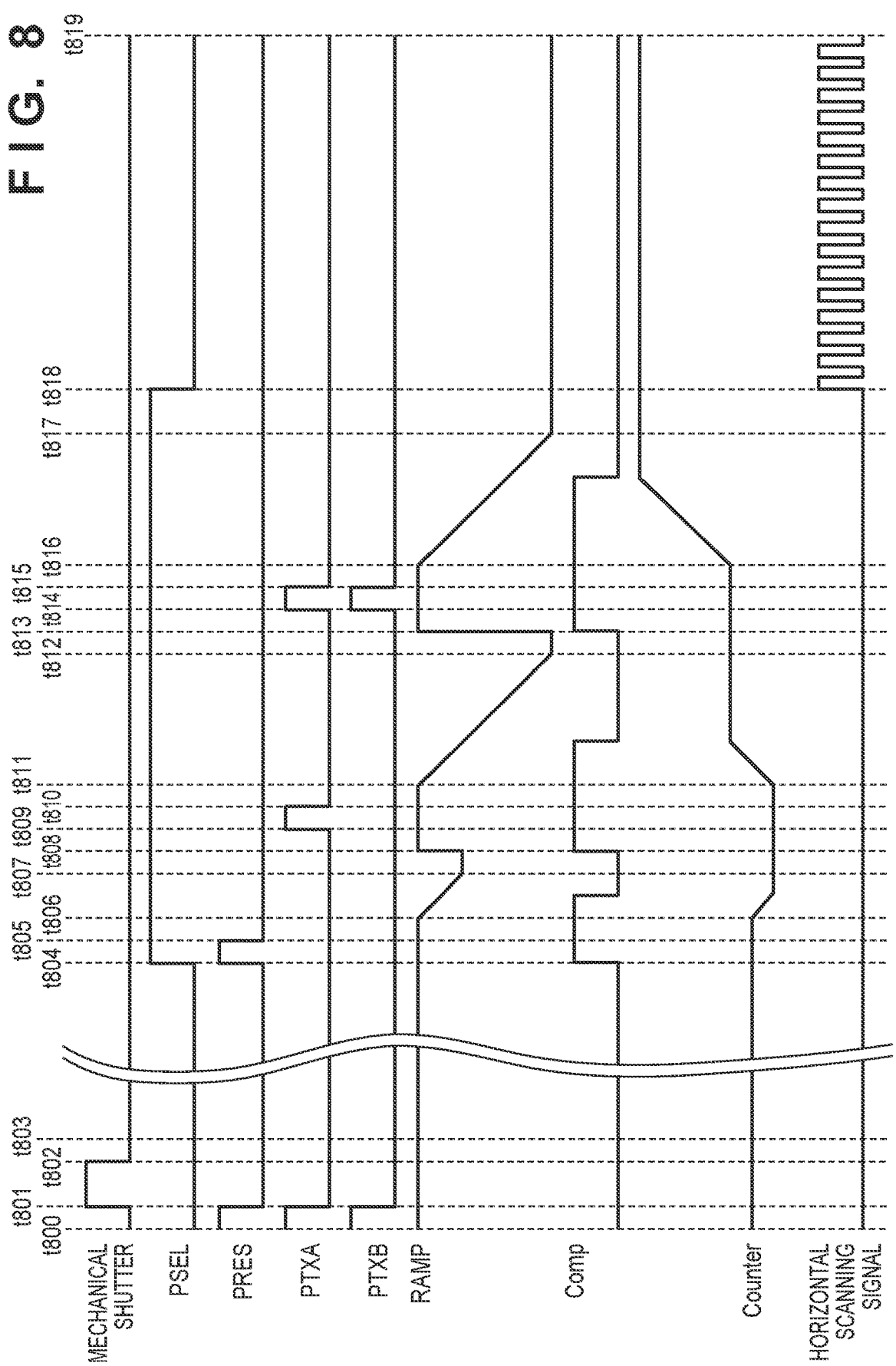
FIG. 8 is a timing chart showing a driving method of the image sensor according to the second and third embodiments.

FIG. 8 is an example of a timing chart showing a driving method of pixel 10 in which the one PD portion 206 is shared by the two PDs 701 and 702. In FIG. 8, PTXA indicates a control signal applied to the gate of the transfer transistor 703, and PTXB indicates a control signal applied to the gate of the transfer transistor 704. Other than the above, since those shown in FIG. 8 are the same as those shown in FIG. 3, description thereof will be omitted.

The timing chart shown in FIG. 8 differs from the timing chart shown in FIG. 3 in the following two points. One point is that the mechanical shutter is opened and pixels are exposed from time t801 to time t803 instead of controlling the charge accumulation using the batch transfer transistor 202. Another point is that from time t813 to time t818, AD conversion for the added signal charge of the PDA 701 and the PDB 702 is performed while the same row is kept selected.

First, the signal charge of the PDA 701 is transferred to the FD portion 206 by setting the control signal PTXA to Hi from time t809 to time t810, and is compared with the RAMP signal from time t811 to time t812 to perform AD conversion. In the second embodiment, the count value Counter obtained by the AD conversion is stored in a memory (not shown) in the AD converter AD(q).

Subsequently, at time t813, the RAMP signal is reset, and without resetting the FD portion 206, the control signals PTXA and PTXB are set to Hi from time t814 to time t815, and the signal charges of the PDA 701 and PDB 702 are transferred to the FD portion 206. Then, from time t816 to time t817, AD conversion is performed by comparing with the RAMP signal. Then, the count value Counter obtained by the AD conversion is stored in a memory (not shown) in the AD converter AD(q).

Then, from time t818 to time t819, the count value corresponding to the signal charge of the PDA 701 stored in the memory (not shown) and the count value corresponding to the added signal charge of the PDA 701 and the PDB 702 are output from the output unit 50 via the horizontal line HL. Then, by performing a subtraction process by a signal processing unit (not shown), a count value corresponding to the signal charge of the PDB 702 can be generated.

With the above-described driving method, since the FD portion 206 is not reset each time signal charge is transferred, it is possible to shorten the period of time taken from the reading of the signal charges of the PDA 701 and the PDB 702 to the AD conversion. In the case where such driving method is premised, it is necessary to reduce the amount of light and charge entering the FD portion 206, that is, to reduce the parasitic sensitivity, as the period in which the FD portion 206 is not reset becomes long.

Therefore, similarly to the first embodiment, by using the DTI obliquely provided between the PDs 701 and 702 and the FD portion 206, the parasitic sensitivity of the FD portion 206 can be reduced while improving the aperture ratio.

Figure 9:
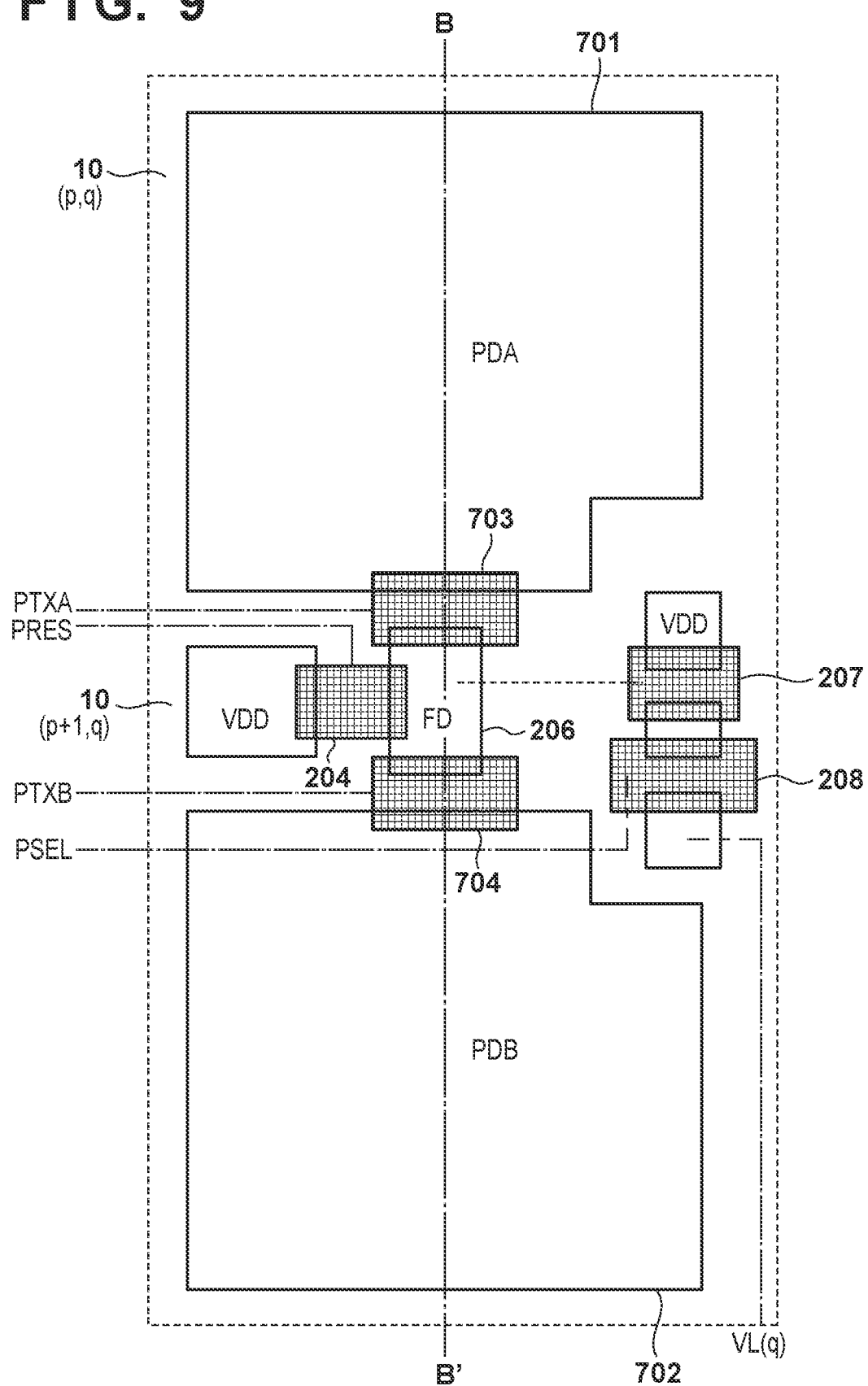
FIG. 9 is a plan view of the pixel of the image sensor according to the second embodiment as viewed from the side opposite to a light incident surface.

FIG. 9 is a plan view showing the gates and their control wiring of transistors viewed from the side opposite to the light incident surface in a case where two pixels vertically adjacent to each other, that is, the pixel 10(p+1, q) and the pixel 10(p, q) share the FD portion 206. A square of broken line represents a plane area for one pixel.

Figure 10:
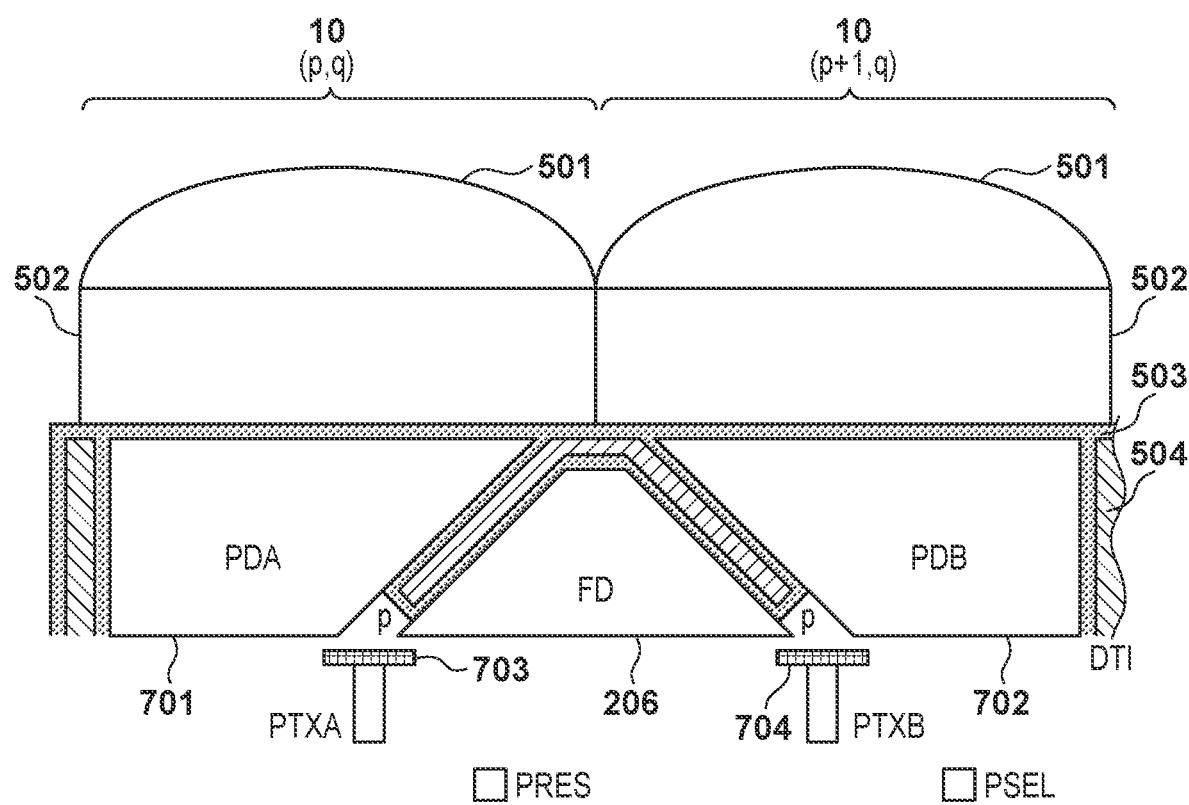
FIG. 10 is a cross-sectional view of the pixel of the image sensor according to the second embodiment.

Further, a cross section taken along a dot-dash line B-B' in FIG. 9 is shown in FIG. 10. Note that, in FIGS. 9 and 10, for easy understanding of the description, the same reference numerals are given to the configurations substantially corresponding to the respective elements shown in the equivalent circuit of FIG. 7. In this cross section shown in FIG. 10, the PDA 701, the PDB 702, the transfer transistor 703, the transfer transistor 704, the FD portion 206, and wirings through which the horizontal common control signals PTXA, PTXB, PRES, and PSEL are provided are crossed.

As shown in FIG. 10, in the DTI, except for a portion between the pixels 10, the FD portion 206, and a portion where the gates of the transfer transistor 703 and the transfer transistor 704 do not pass, the DTI is preferably configured to penetrate the semiconductor substrate to suppress color mixture. On the other hand, in the cross section within the pixel such as the cross section taken along the line B-B' passing through the FD portion 206, the transfer transistor 703, and the transfer transistor 704, the DTI is obliquely provided with respect to the light incident surface, so that areas of the PDs 701 and 702 become wide.

As a result, in the FD reset release period from time t805 to time t817, it is possible to suppress light incidence on the FD portion 206 and reduce parasitic sensitivity while improving the aperture ratio. In particular, visible light having a relatively short penetration length undergoes photoelectric conversion at a shallow depth from the light incident surface, it is possible to improve sensitivity at a full-open aperture value where the range of the light incident angle is wide.

In addition, also in the second embodiment, the intra-pixel DTI may be formed only with the light shielding member 504.

Further, since the charge transfer channel is formed as described above, it is preferable that the obliquely provided intra-pixel DTI does not penetrate to the surface opposite to the light incident surface. In that case, similarly to the batch transfer transistor 202 of the modification of the first embodiment, the transfer transistors 703 and 704 may have vertical transfer gates.

As described above, according to the second embodiment, the same effect as that of the first embodiment can be obtained even in the configuration in which the PDA and the PDB share one circuit unit including the batch transfer transistor 202 to the FD portion 206.

<Modification>

As a modified of the second embodiment, each pixel 10 (p, q) has one ML and two photodiodes PDA 701 and PDB 702 to respectively receive light that has passed through different pupil regions of the imaging optical system.

Figure 11:
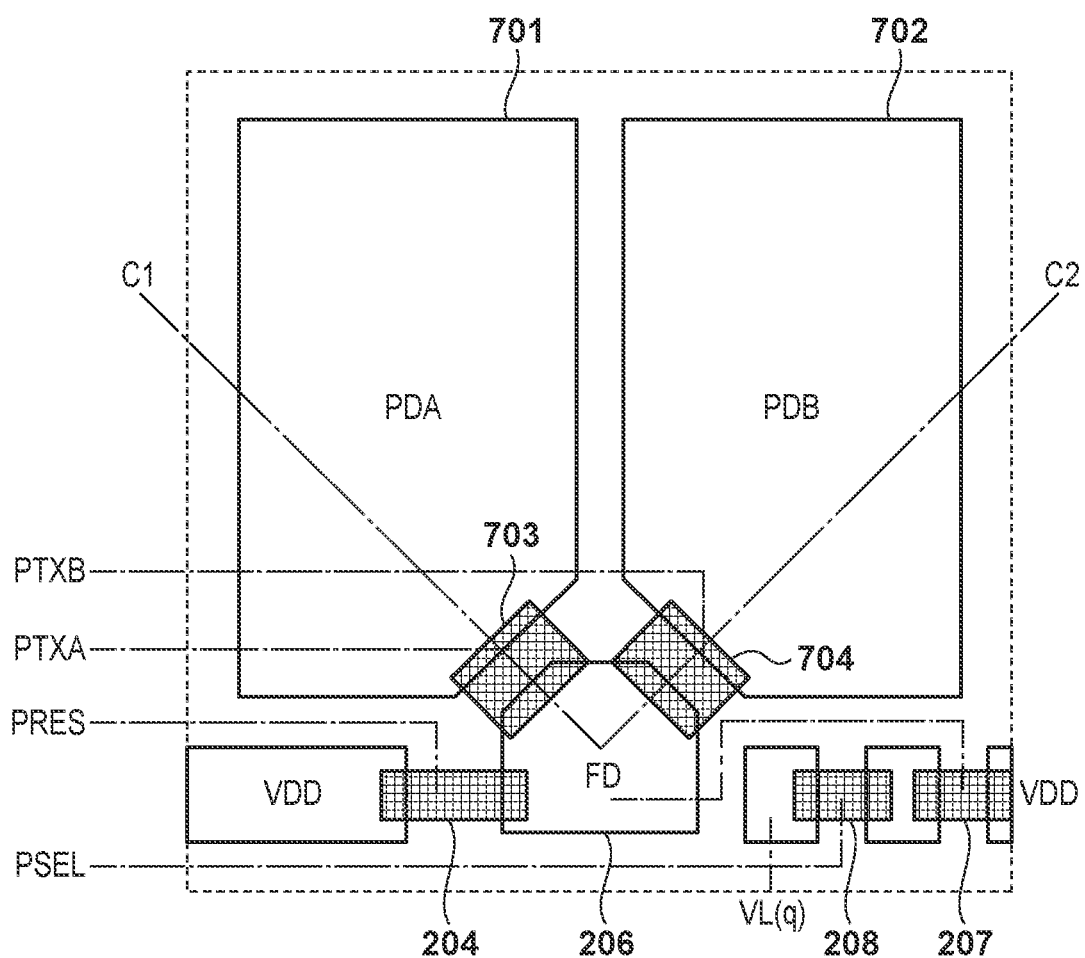
FIG. 11 is a plan view of a pixel of the image sensor according to a modification of the second embodiment as viewed from the side opposite to a light incident surface.

FIG. 11 is a plan view of the pixel 10(p, q) according to the present modification as seen from the side opposite to the light incident surface. FIG. 11 differs from FIG. 9 in that the PDA 701 and the PDB 702 are photoelectric conversion units which divide one pixel described above into two, but the other configurations are the same. The count value corresponding to the added signal charge of the PDA 701 and the PDB 702 is used as an image signal, and the count value corresponding to the signal charge of the PDA 701 is subtracted from the count value corresponding to the added signal charge to obtain the count value corresponding to the signal charge of the PDB 702. By performing a well-known correlation calculation using the signals of the PDA 701 and PDB 702 obtained in this way, the imaging optical system can be focused.

Figure 12:
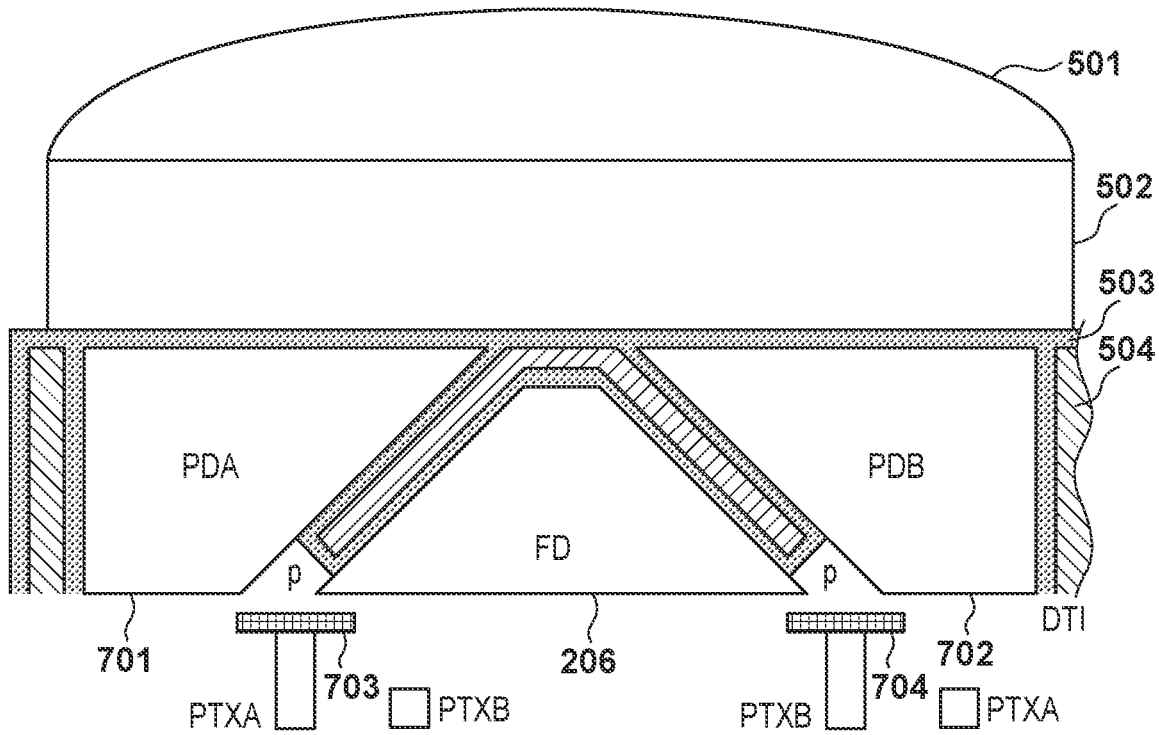
FIG. 12 is a cross-sectional view of the pixel of the image sensor according to the modification of the second embodiment.

FIG. 12 shows a cross-sectional view taken along a dot-dash line C1-C2 in FIG. 11. FIG. 12 differs from FIG. 10 in that one microlens 501 is shared by the PDA 701 and the PDB 702 formed in one pixel 10. As shown in this cross-sectional view, with the intra-pixel DTI and the PDA 701 and PDB 702 whose area at each depth increases toward the light incident surface, it is possible to reduce the parasitic sensitivity of the FD portion 206 while improving the aperture ratio. In particular, since visible light having a relatively short penetration length undergoes photoelectric conversion at a shallow depth from the light incident surface, it is possible to improve sensitivity at a full-open aperture value where the range of the light incident angle is wide.

As another modification of the second embodiment, as shown in FIG. 12, when the PDA 701 and the PDB 702 capable of receiving light by dividing the pupil of the imaging optical system are provided in one pixel 10(p, q), the pixel 10(p, q) may share one FD portion 206 with a vertically adjacent pixel 10(p+1, q). As for the driving method in that case, first, the count values corresponding to the signal charges of the PDA 701 and PDB 702 of the pixel 10(p, q) are read at timings shown in the timing chart of FIG. 8. After that, the vertical scanning circuit 20 selects the p+1th row and the count values corresponding to the signal charges of the PDA 701 and the PDB 702 of the pixel 10(p+1, q) are read in the same manner.

Third Embodiment

Next, a third embodiment of the present invention will be described. In the third embodiment, a case will be described in which the DTI is used to adjust a saturation charge amount in accordance with the transmittance of a color filter. Note that the equivalent circuit of each pixel 10 and the method of driving the image sensor in the third embodiment are the same as those shown in FIGS. 7 and 8, respectively, and thus description thereof will be omitted here.

Further, the plan view of the pixel in the third embodiment as seen from the side opposite to the light incident surface is the same as that shown in FIG. 9, and thus detailed description thereof will be omitted. However, in the third embodiment, for example, the pixel 10(p, q) is covered by a red (R) color filter and pixel 10(p+1, q) is covered by a green (G) color filter according to a known Bayer array color filter.

Generally, a green (G) color filter has a high transmittance and signal charge generated in a pixel covered by the green (G) color filter is large in many shooting scenes. In accordance therewith, it is necessary to increase the saturation charge amount in the pixel covered by the green (G) color filter. On the other hand, red (R) and blue (B) color filters have low transmittance, and the saturation charge amounts in pixels covered by the red (R) and blue (B) color filters do not need to be as high as that of a pixel covered by the green (G) color filter in many cases. Therefore, in the third embodiment, the circuits provided downstream of the FD are arranged in an area closer to the pixel 10(p, q) covered by the red (R) color filter in accordance with such the required saturation charge amounts. That is, in the plan view viewed from the side opposite to the light incident surface, the area of the PDA 701 is reduced, and the area of the PDB 702 of the pixel 10(p+1, q) of green (G) is increased accordingly.

Figure 13:
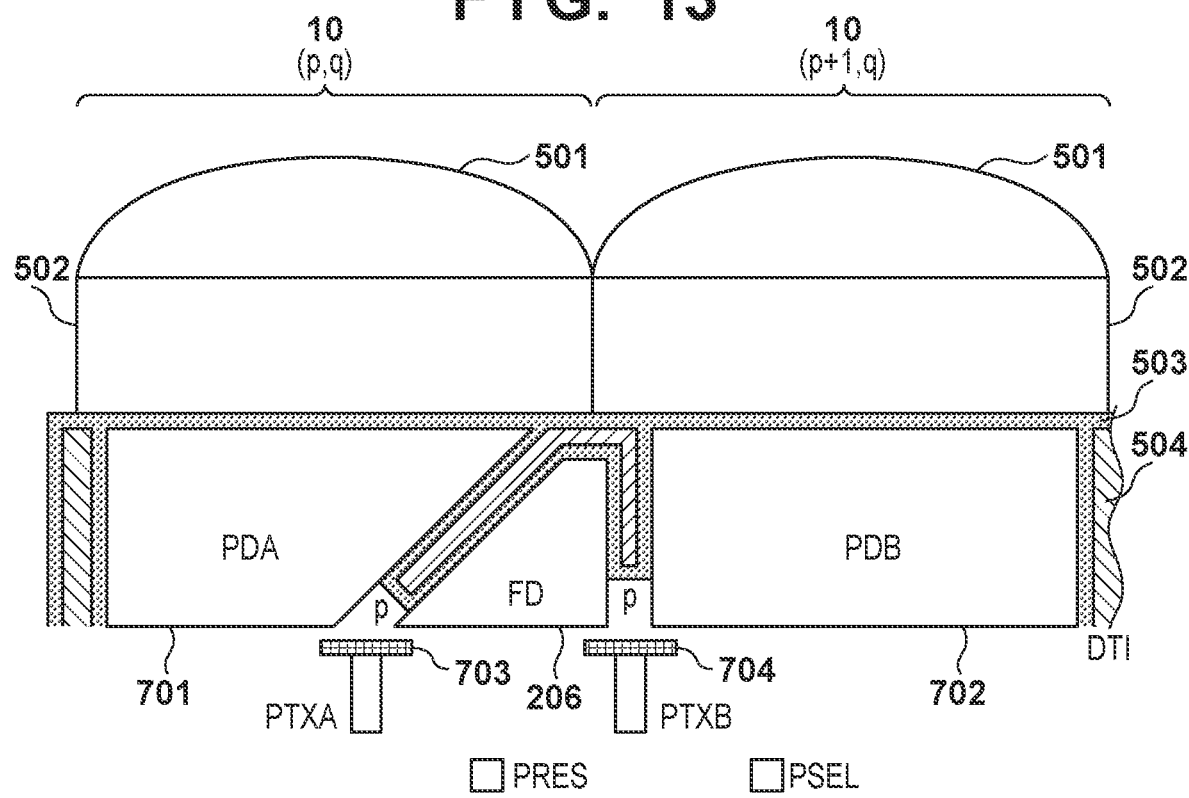
FIG. 13 is a cross-sectional view of a pixel of the image sensor according to a third embodiment.

FIG. 13 is a cross-sectional view of the pixel 10(p, q) and the pixel 10(p+1, q) according to the third embodiment, taken along the dot-dash line B-B' in FIG. 9. FIG. 13 differs from FIG. 10 in that the aperture ratio of the PDA 701 is improved by using the intra-pixel DTI obliquely provided between the PDA 701 and the FD portion 206, while the decreased volume of the PDA 701 is allocated to the PDB 702. Therefore, the intra-pixel DTI between the PDB 702 and the FD portion 206 is not necessarily obliquely provided. By doing so, it is possible to effectively adjust the saturation charge amount required by pixels covered by respective color filter.

On the side opposite to the light incident surface, it is possible to prevent the light incident on pixel 10(p, q) from entering the FD portion 206 and the charge generated in the PDA 701 from being mixed into the FD portion 206 by using the obliquely arranged intra-pixel DTI while biasing the circuit and control wiring arrangement.

As described above, according to the third embodiment, in addition to the effect similar to that of the first embodiment, the saturation charge amount can be easily assigned.

It should be noted that this embodiment can be applied to an image sensor including the batch holding unit 205 as described in the first embodiment. In that case, such an obliquely provided intra-pixel DTI may be used for allocating the capacitance of charge that can be held in the batch holding unit 205.

Further, depending on the transmittance of each color filter, the volume of PDs covered by the red (R) color filter and the blue (B) color filter may be increased by using the intra-pixel DTI that is obliquely provided between the PD and the FD section of a pixel covered by the green (G) color filter.

<Modification>

Figure 14:
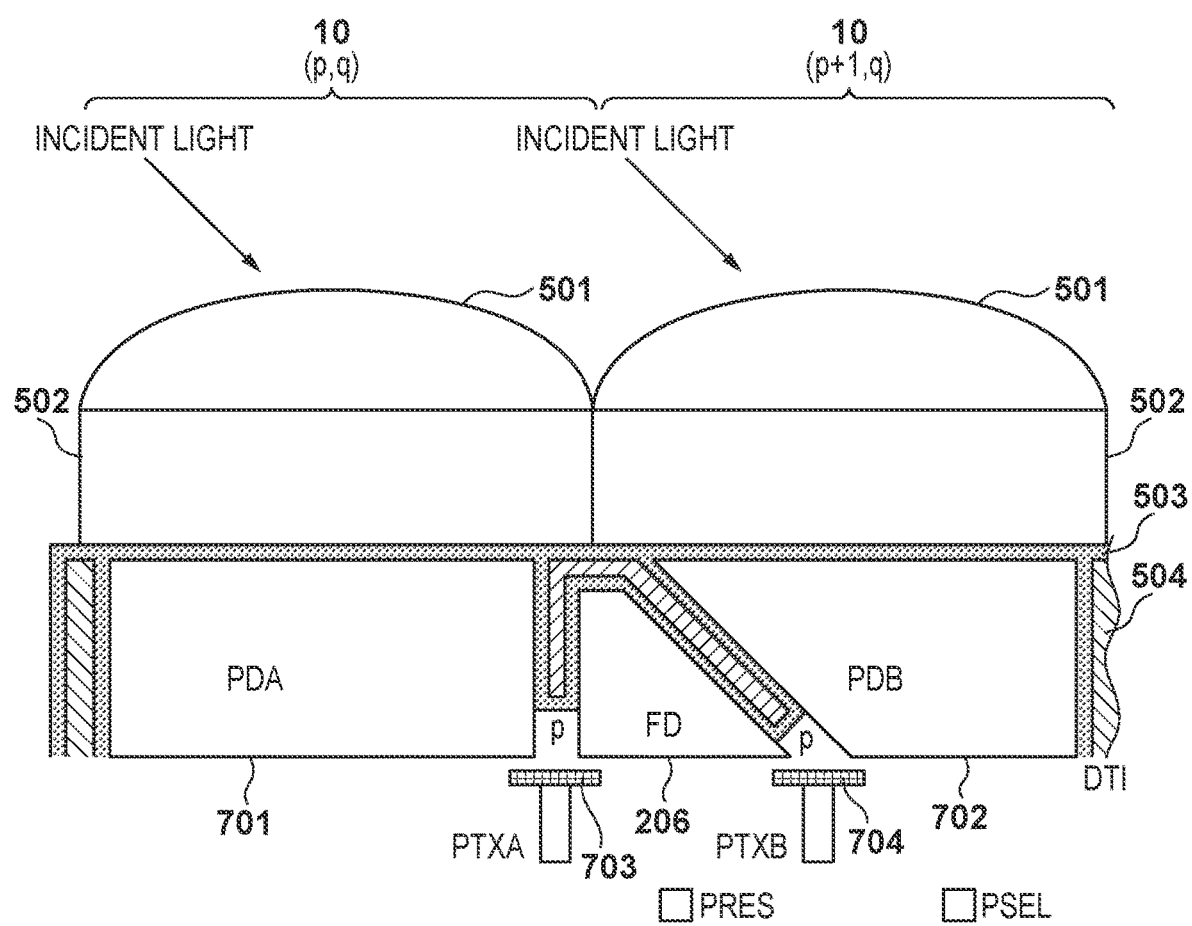
FIG. 14 is a cross-sectional view of a pixel of the image sensor according to a modification of the third embodiment.

In addition, a pixel having intra-pixel DTI as shown in FIG. 14 may be arranged at an image height opposite to the image height at which the pixel shown in FIG. 13 is arranged so that the tilt direction of the obliquely formed intra-pixel DTI is the same as that of the principal ray from the pupil position of the imaging optical system at a high image height. By doing so, it is possible to suppress the leakage of incident light at the vicinity of the transfer gate where the intra-pixel DTI does not penetrate the semiconductor substrate and reduce the parasitic sensitivity.

Figure 15:
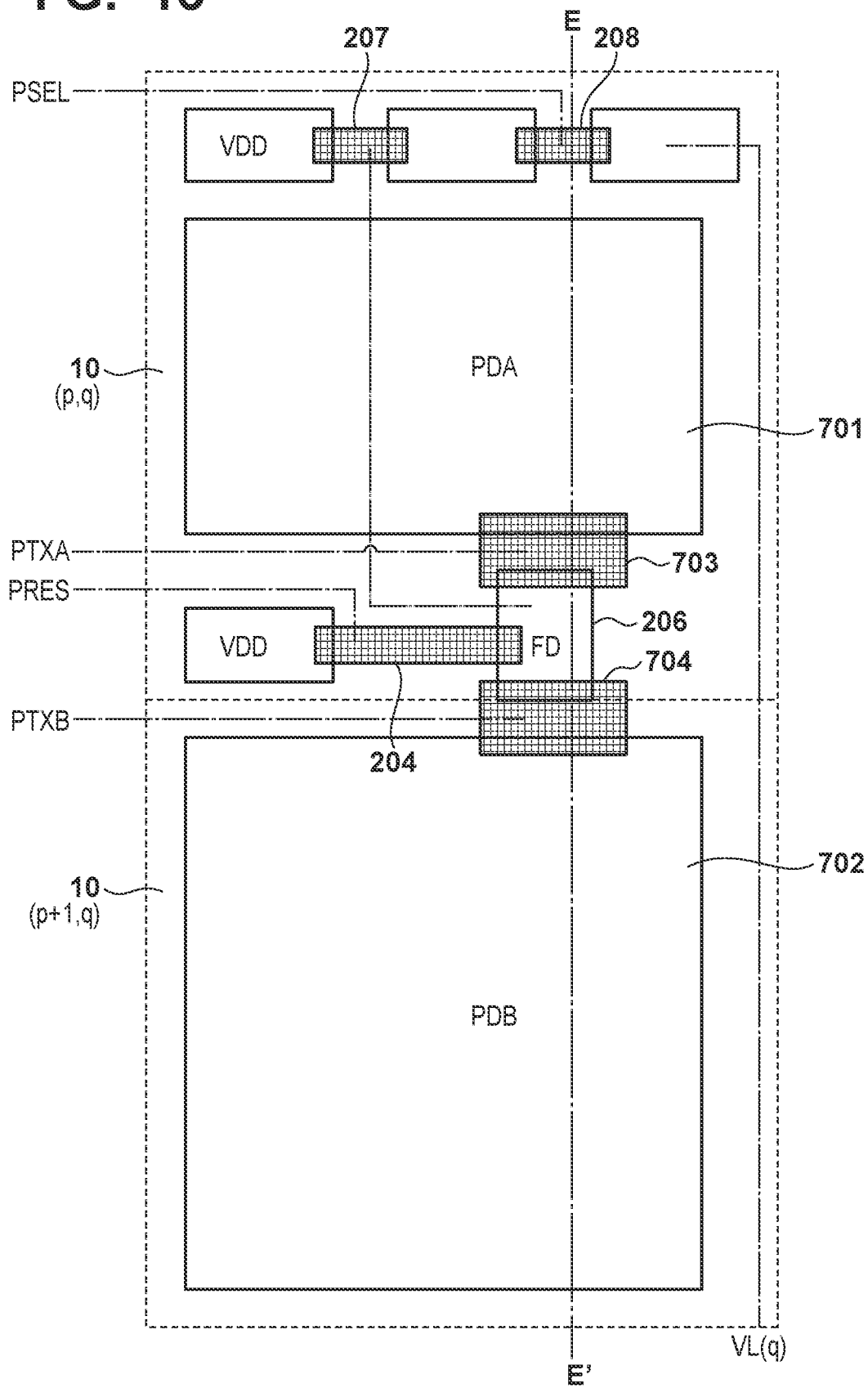
FIG. 15 is a plan view of the pixel of the image sensor according to the modification of the third embodiment as viewed from the side opposite to a light incident surface.
Figure 16:
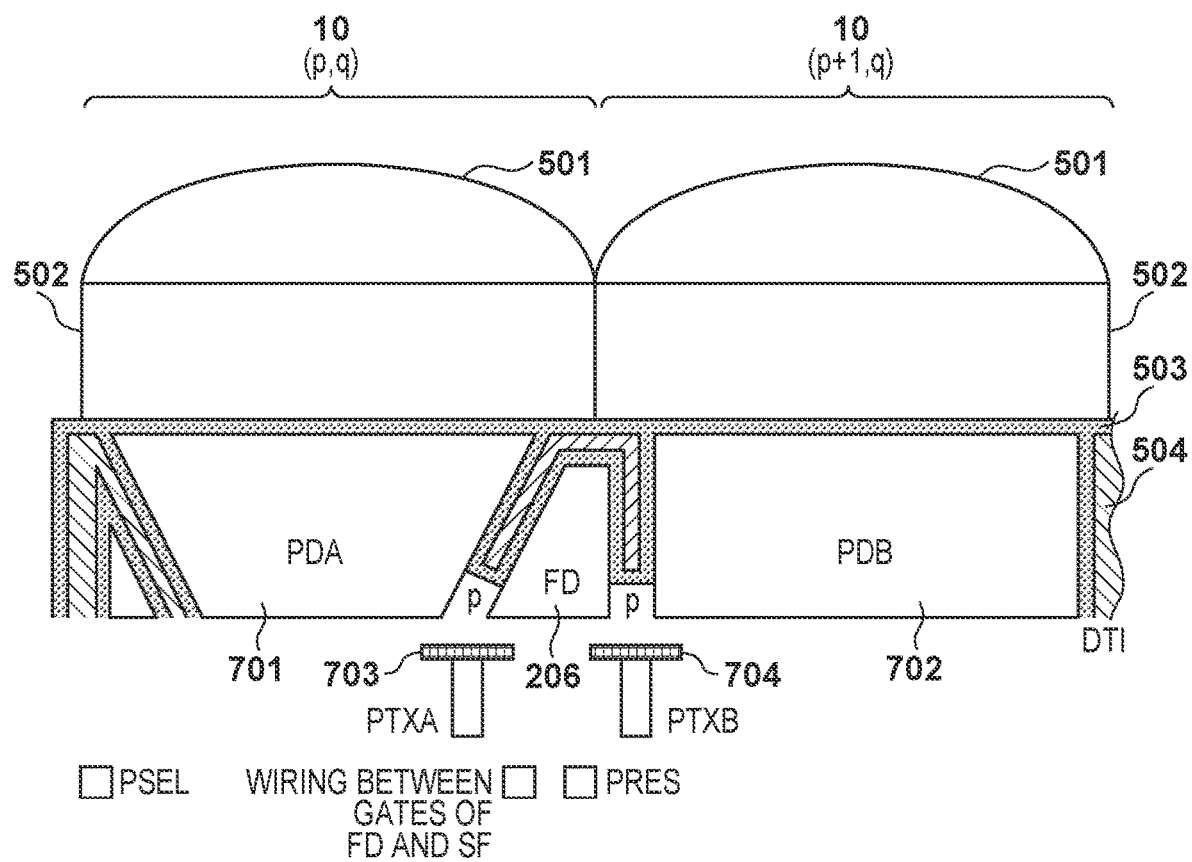
FIG. 16 is a cross-sectional view of a pixel of the image sensor according to another modification of the third embodiment.

Furthermore, as shown in a plan view of FIG. 15 and a sectional view of FIG. 16, the intra-pixel DTI may be used in a portion other than the portion between the PD and the FD portion. For example, in FIG. 15, the FD portion 206 and the reset transistor 204, and an amplifier circuit including the amplification transistor 207 and the selection transistor 208 that form the transfer circuit downstream of the FD portion 206 are separately arranged below and above the PDA 701. Also, the FD portion 206 and the gate of the amplification transistor 207 are connected by wiring. In this way, the gates are arranged evenly above and below the PDA 701, and accordingly, the intra-pixel DTI is obliquely provided on the upper and lower ends of the PDA 701 as shown in FIG. 16. FIG. 16 is a cross-sectional view taken along a dot-dash line E-E' of FIG. 15. By using the intra-pixel DTI obliquely arranged in this way, it is possible to improve the optical symmetricity of the DTI with respect to the PDA. Note that the intra-pixel DTI that separates the PDA 701 and the amplifier circuit may penetrate the semiconductor substrate.

The image sensor described in each of the above embodiments can be applied to an image capturing apparatus in various devices such as a digital camera, a digital video camera, a smartphone, a mobile phone with a camera, and a dashboard camera.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-169580, filed on Sep. 18, 2019 which is hereby incorporated by reference herein in its entirety.

What is claimed is:

1. An image sensor comprising:
   a plurality of photoelectric conversion portions that convert light incident on a first surface of a semiconductor substrate into charge;
   a plurality of circuit portions, controlled from a second surface that is an opposite surface of the first surface of the semiconductor substrate, for transferring the charge converted by the photoelectric conversion portions; and
   first separation portions that separate the photoelectric conversion portions and the circuit portions for transferring the charge converted by the photoelectric conversion portions,
   wherein at least part of the first separation portions are formed such that the area of the first surface is larger than the area of the second surface of at least part of the respective photoelectric conversion portions,
   wherein each of the plurality of circuit portions is shared by a plurality of the photoelectric conversion portions, and each of the first separation portions is formed between the each circuit portion and the photoelectric conversion portions that share the each circuit portion, and wherein each of the plurality of photoelectric conversion portions is covered by a color filter of any of a plurality of colors, and the first separation portions are formed so that the volumes of the photoelectric conversion portions vary depending upon transmittances of the color filters.

2. The image sensor according to claim 1, wherein the first separation portions are obliquely formed in a depth direction of the semiconductor substrate.

3. The image sensor according to claim 1, wherein the first separation portions are not in contact with the second surface.

4. The image sensor according to claim 3, wherein each of the circuit portions includes a transfer transistor for transferring the charge converted by the photoelectric conversion portion and a holding portion for holding the charge transferred by the transfer transistor, and the transfer transistor has a vertical transfer gate arranged between the first separation portion and the second surface.

5. The image sensor according to claim 1 further comprising a plurality of microlenses, wherein each of the plurality microlenses covers the photoelectric conversion portions that share the each circuit portions.

6. The image sensor according to claim 1, wherein the first separation portions are formed so that the higher the transmittance of the color filter that covers the photoelectric conversion portion is, the greater the volume of the photoelectric conversion is.

7. The image sensor according to claim 1, wherein each of the plurality of circuit portions has a holding portion that holds the charge transferred from the photoelectric conversion portions and a transfer circuit that transfers the held charge to outside of a pixel, and
wherein, among the plurality of pixels including the photoelectric conversion portions that share the circuit portion, the transfer circuit is formed in the pixel covered by the color filter having lower transmittance than the other pixel or pixels.

8. The image sensor according to claim 1, wherein the first separation portions are formed so that the depths of the photoelectric conversion portions in the semiconductor substrate change, shallower on a center side and deeper on a peripheral side.

9. The image sensor according to claim 1, wherein the first separation portions are formed so as to separate the plurality of photoelectric conversion portions that share the each circuit portion from each other.

10. The image sensor according to claim 1 further comprising second separation portions that separate between groups each having each of the plurality of circuit portions and the photoelectric conversion portion or portions corresponding to the each circuit portion, wherein the first separation portions and the second separation portions are connected on the first surface.

11. The image sensor according to claim 10, wherein the second separation portions penetrate from the first surface to the second surface.

12. The image sensor according to claim 10, wherein the second separation portions are made of a metal light shielding member.

13. The image sensor according to claim 12, wherein the second separation portions further include a pining film that covers the metal light shielding member.

14. The image sensor according to claim 1, wherein each of the first separation portions is made of a metal light shielding member.

15. The image sensor according to claim 14, wherein each of the first separation portions further includes a pining film that covers the metal light shielding member.

16. The image sensor according to claim 1, wherein the plurality of circuit portion respectively have batch transfer transistors that transfer charge converted by the plurality of photoelectric conversion portions simultaneously, and batch holding portions that hold the charge transferred by the batch transfer transistors.

17. An image capturing apparatus comprising:
an image sensor including:
a plurality of photoelectric conversion portions that convert light incident on a first surface of a semiconductor substrate into charge;
a plurality of circuit portions, controlled from a second surface that is an opposite surface of the first surface of the semiconductor substrate, for transferring the charge converted by the photoelectric conversion portions; and
first separation portions that separate the photoelectric conversion portions and the circuit portions for transferring the charge converted by the photoelectric conversion portions; and
a processing unit that processes a signal output from the image sensor,
wherein at least part of the first separation portions are formed such that the area of the first surface is larger than the area of the second surface at least part of the respective photoelectric conversion portions,
wherein each of the plurality of circuit portions is shared by a plurality of the photoelectric conversion portions, and each of the first separation portions is formed between the each circuit portion and the photoelectric conversion portions that share the each circuit portion, and
wherein each of the plurality of photoelectric conversion portions is covered by a color filter of any of a plurality of colors, and the first separation portions are formed so that the volumes of the photoelectric conversion portions vary depending upon transmittances of the color filters.

18. A manufacturing method of an image sensor comprising:
forming, in a semiconductor substrate, first separation portions that penetrate from a first surface on which light is incident to a second surface that is opposite side of the first surface;
forming a plurality of circuit portions that are controlled by the second surface for transferring charge converted by photoelectric conversion portions;
forming second separation portions that separate the circuit portions and the photoelectric conversion portions; and
forming the photoelectric conversion portions that converts light incident on the first surface into charge,
wherein at least part of the first separation portions and the second separation portions are formed so that the area of the first surface is larger than the area of the second surface of at least part of the respective photoelectric conversion portions,
wherein each of the plurality of circuit portions is shared by a plurality of the photoelectric conversion portions, and each of the first separation portions is formed between the each circuit portion and the photoelectric conversion portions that share the each circuit portion, and wherein each of the plurality of photoelectric conversion portions is covered by a color filter of any of a plurality of colors, and the first separation portions are formed so that the volumes of the photoelectric conversion portions vary depending upon transmittances of the color filters.

* * * * *